United States Patent [19]
Tagusari et al.

[11] Patent Number: 5,858,517
[45] Date of Patent: Jan. 12, 1999

[54] ELECTRODEPOSITED COPPER FOIL FOR PRINTED WIRING BOARD AND METHOD OF MANUFACTURING THE SAME

[75] Inventors: Hideyasu Tagusari, Tokyo; Yutaka Hirasawa, Okegawa; Kazuhide Oshima, Ageo, all of Japan

[73] Assignee: Mitsui Mining & Smelting Co., Ltd., Tokyo, Japan

[21] Appl. No.: 783,575

[22] Filed: Jan. 15, 1997

[30] Foreign Application Priority Data

Jan. 16, 1996 [JP] Japan ................... 8-021618

[51] Int. Cl.⁶ ............... C25D 7/06; B32B 15/20
[52] U.S. Cl. ............ 428/209; 428/607; 428/626; 428/658; 428/675; 428/687; 428/935; 205/111
[58] Field of Search .................. 428/209, 607, 428/626, 658, 935, 687, 675; 205/111

[56] References Cited

U.S. PATENT DOCUMENTS

| | | | |
|---|---|---|---|
| 5,215,646 | 6/1993 | Wolski et al. | 205/77 |
| 5,437,914 | 8/1995 | Saida et al. | 428/209 |
| 5,482,784 | 1/1996 | Ohara et al. | 428/607 |
| 5,545,466 | 8/1996 | Saida et al. | 428/209 |

FOREIGN PATENT DOCUMENTS

| | | |
|---|---|---|
| 145800 | 8/1984 | Japan . |
| 87-042022 | 8/1984 | Japan . |
| 06 252 548 A | 9/1994 | Japan . |
| 6-270331 | 9/1994 | Japan . |

*Primary Examiner*—Cathy F. Lam
*Attorney, Agent, or Firm*—Arnold, White & Durkee

[57] ABSTRACT

An electrodeposited copper foil for use in the manufacture of a printed wiring board in which the original profile of the matte surface has been completely removed, preferably by buffing, leaving a surface having linear streaks and a roughness 1.5 μm or less. The new surface is then given a nodule forming treatment which produces a surface roughness of 1.5 to 2.0 μm, which may be followed by a corrosion resisting treatment. This invention further provides a method of manufacturing such an electrodeposited copper foil. Such copper foils are especially useful in making fine circuit patterns.

4 Claims, 7 Drawing Sheets

W1: Line width at top
W2: Line width at bottom
T: Thickness of Cu foil $$\text{Etching factor} = \frac{2T}{(W2 - W1)}$$

SEM Photograph

W : Width at bottom
Wmax : Maximum width at bottom
Wmin : Minimum width at bottom

[Non-uniformity of W] = Standard deviation X [Wmax − Wmin]

ELECTRODEPOSITED COPPER FOIL FOR PRINTED WIRING BOARD AND METHOD OF MANUFACTURING THE SAME

BACKGROUND OF THE INVENTION

1. Field of the Invention

This invention relates to an electrodeposited copper foil for use in the manufacture of printed wiring boards and a method for manufacturing the electrodeposited copper foil. In particular, this invention relates to an electrodeposited copper foil having a fine nodular electrodeposit which is uniformly and densely formed on the matte or rough surface side of the electrodeposited copper foil, the matte surface side of the electrodeposited copper foil being removed by buffing before the fine nodules are deposited. The electrodeposited copper foil formed in this manner has excellent etching properties and hence is suited for forming ultra-fine circuit patterns which have excellent high-frequency characteristics and which provide good insulation reliability.

2. Description of Related Art

The electrodeposited copper foil employed in the manufacture of a printed wiring board is generally obtained by electrodepositing copper on the surface of a cathode drum, and then separating the resulting electrodeposited copper layer from the cathode drum. One side of this electrodeposited copper foil is formed next to the drum and is relatively smooth (i.e. shiny or glossy), but the outer surface on which copper deposits are grown has a matte appearance (i.e. a rough profile). The copper-clad laminated board employed in the manufacture of printed wiring boards is manufactured by forming a nodular or granular copper electrodeposit on the matte surface of electrodeposited copper foil (a nodular forming treatment), and then laminating this treated surface of the foil to a resin substrate, typically a glass fiber-epoxy composite or polyimide film. The wiring pattern of the printed wiring board is made by etching this copper-clad laminated board.

However, in view of the recent trend toward making ultra-fine patterns on printed wiring boards, the irregularity of the matte surface side of the copper foil has caused a problem. The irregularity of the matte surface side of the copper foil is relatively large as compared with the fineness of a wiring pattern which is to be formed on the printed wiring board, thereby causing a deterioration in the reliability of the insulation between circuit lines or between opposing circuit layers.

In order to overcome this problem, there has been recently employed a very low profile foil (VLP foil), i.e. an electrodeposited copper foil whose matte surface is controlled to have a low roughness. According to JIS B 0601, an ordinary electrodeposited copper foil having a thickness of 18 μm has a surface roughness of 5 to 8 μm on its matte side. Whereas, in the case of the VLP foil, the surface roughness matte side is about 3 to 5 μm. On the other hand, the surface roughness of the shiny surface (the smooth surface side) of this electrodeposited copper foil, which is opposite to the matte surface side, is about 1.5 to 2.0 μm irrespective of the thickness and type of the electrodeposited copper foil since this smooth surface is transferred from the surface of the drum.

Even if the surface roughness of the VLP foil is relatively low, some degree of roughness still remains on the surface of the VLP foil and the nodules formed in the nodular treatment are concentrated at the tops of convex portions or peaks which constitute the surface roughness. If the nodules are concentrated in this manner, they may become copper remnants embedded in the substrate after the formation of a fine circuit pattern so that extra-etching for removing these copper remnants may be required. If this extra-etching is performed, the fine pattern is over-etched, thus causing the line width of the pattern to become narrower than desired.

A method for forming a fine pattern has been proposed (Japanese Patent Application Kokai No. Hei 6-270.331) wherein the aforementioned nodular forming treatment is carried out on the smooth surface (shiny) side of an electrodeposited copper foil, and then a substrate is laminated on to the smooth surface side, thereby manufacturing a copper-clad laminated board which can be used for forming a fine circuit pattern. However, according to this Japanese Patent Application (Kokai No. Hei 6-270,331), it is difficult to uniformly electrodeposit copper granules on the smooth surface of an electrodeposited copper foil. Although the surface roughness Rz after the nodular forming treatment is as low as 2.0 to 2.2, nodules of relatively large size are locally formed, thereby making it difficult to employ such foils in making an ultra-fine circuit pattern.

It has also been proposed that the aforementioned nodular forming treatment should be carried out after an electrodeposited copper foil is worked by rolling so that the shape of the matte surface is not completely eliminated (Japanese Patent Application Kokoku No. Sho 62-42, 022).

Furthermore, it has been proposed that the aforementioned nodular forming treatment should be carried out after the electrodeposited copper foil has been subjected to grinding, planing, plasma discharge or electrolytic polishing so that the original irregular surface on the matte side of the foil is not completely eliminated (Japanese Patent Application Kokai No. Sho 59-145,800).

However, in any of these methods of forming nodules part of the original rugged surface of the copper foil still remains, so that it is difficult to carry out a uniform formation of minute nodules, i.e. it is impossible to avoid local electrodeposition of nodules, thus failing to reduce the roughness of the original matte surface of the foil to any substantial degree. In other words, it has been impossible according to the prior art to obtain an electrodeposited copper foil which has excellent etching properties and thus is suited for use in forming ultra-fine circuit patterns which have excellent high-frequency characteristics and which provide good insulation reliability.

SUMMARY OF THE INVENTION

The present invention solves the aforementioned problems, and therefore an object of the present invention is to provide an electrodeposited copper foil which has excellent adhesion to a substrate and etching properties and is useful for making ultra-fine circuit patterns having excellent high-frequency characteristics and which provide good insulation reliability.

Another object of this invention is to provide a method of forming such an excellent electrodeposited copper foil.

It has been found by the present inventors after intensive studies on the aforementioned problems that it is possible to solve these problems by buffing the matte surface side of an electrodeposited copper foil so as to completely remove the original profile of the matte surface and at the same time to form a fresh surface having buffed streaks and a surface roughness of 1.5 μm or less, and then by uniformly forming nodules of copper by electrodeposition on this freshly roughened surface (a nodule forming treatment), thereby obtaining an electrodeposited copper foil having a surface roughness of 1.5 to 2. μm. According to this process, it is possible to obtain an electrodeposited copper foil for use in printed wiring boards, which has excellent adhesion to a substrate and etching properties and is useful in the forming of ultra-fine circuit patterns having excellent high-frequency characteristics and which provide good insulation reliability.

The invention provides an electrodeposited copper foil in which the original profile of the matte surface thereof has been completely extinguished and a fine surface having buffed streaks has been newly formed thereon, characterized in that a surface roughness of the matte surface before forming a nodular deposit is 1.5 μm or less and the surface roughness thereof after forming the nodular deposit is 1.5 to 20 μm.

DESCRIPTION OF PREFERRED EMBODIMENTS

Figures 1, 2:
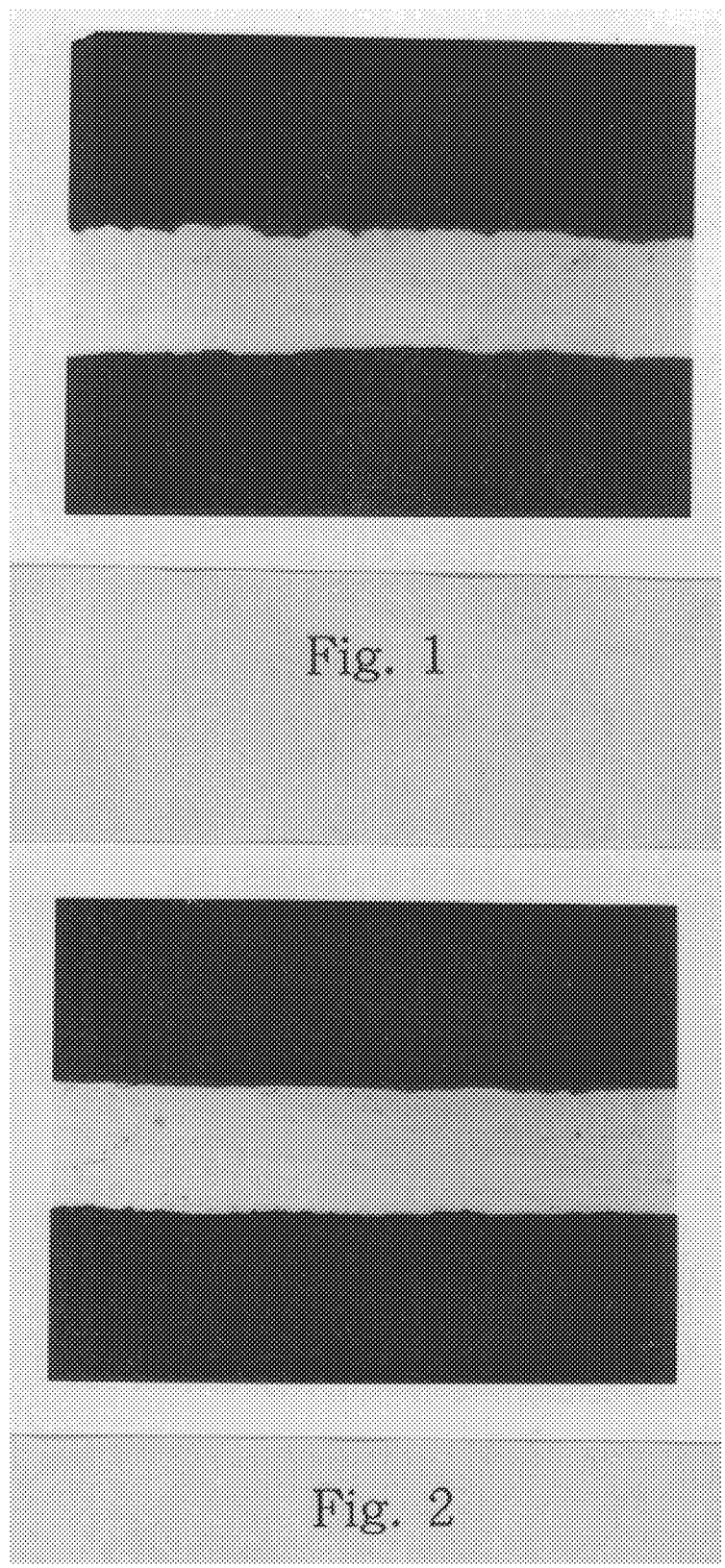
FIG. 1 is a microscopic photograph showing a cross-section of an electrodeposited copper foil (18 μm in thickness) before a buffing treatment is given to the foil.
FIG. 2 is a microscopic photograph showing a cross-section of an electrodeposited copper foil (18 μm in thickness) whose matte surface side has been subjected to a buffing treatment using a #1,000 buff wherein aluminum oxide is employed as an abrasive material.

The copper foil to be employed in this invention may be an ordinary copper foil whose matte side is relatively high in roughness as well as a very low profile foil (VLP copper foil) whose matte surface is very low in roughness. In the following explanation, the embodiments where the VLP copper foil was employed will be noted.

By the term, "nodule forming treatment" is meant a treatment for forming a fine granular copper electrodeposit from an electrolytic solution on the matte side of an electrodeposited copper foil, thereby improving the anchoring of the electrodeposited copper foil to a substrate.

The roughness of the foil surfaces are expressed as Rz, defined as the average roughness measured with a profilometer over a distance of 2.5 mm.

The electrodeposited copper foil for use in a printed wiring board according to this invention is characterized by having the matte side of the electrodeposited copper foil (i.e. the surface on which the copper deposit grows) given a buffing treatment to form a surface roughness of 1.5 μm or less, and then giving this buffed surface a nodular forming treatment to obtain a surface roughness of 1.5 to 2.0 μm after such nodular surface-forming treatment.

If the roughness of the matte surface side of electrodeposited copper foil after the buffing treatment is more than 1.5 μm, the granular (nodular) copper electrodeposit is more likely to be undesirably concentrated at the top portion of convex or peak portions of the buffed surface.

If the surface roughness of the matte surface side of the electrodeposited copper foil after forming a granular (nodular) copper electrodeposit thereon is less than 1.5 μm, the peel strength of the wiring pattern will be insufficient. On the other hand, if the surface roughness of the matte surface side of the electrodeposited copper foil after the formation of a granular (nodular) copper electrodeposit thereon exceeds 2.0 μm, relatively large nodules may be locally grown, thus deteriorating the etching properties, high-frequency characteristics and the insulation reliability of the resultant electrodeposited copper foil.

The method for manufacturing an electrodeposited copper foil according to this invention comprises the steps of buffing the matte surface of a electrodeposited copper foil to completely extinguish the original profile of the matte surface, further buffing the completely extinguished matte surface to newly form a fine roughness having buffed streaks and to control the roughness of the matte surface to 1.5 μm or less, and finally, subjecting said matte surface to a nodule forming treatment to control the surface roughness to 1.5 to 2.0 μm after said nodule forming treatment.

According to a method for manufacturing an electrodeposited copper foil of this invention, an electrodeposited copper foil is passed through a guide roll and at the same time, the matte side of the foil is pressed onto a buffer so as to completely remove the original profile of the matte surface side and concurrently to form a surface having a roughness of 1.5 μm or less based on Rz (an average roughness of ten measuring points). A preferred method employs a cylindrical buffer of the type employed for cleaning and polishing the cathode drums on which the foil is made. In such buffers a web of plastic fibers has attached to them abrasive aluminum particles. The number of revolution of the buffer preferably should be 100 to 1,000 rpm. If the number of revolutions of the buffer is less than 100 rpm, it is difficult to form a uniform surface roughness. On the other hand, if the number of revolutions of the buffer is more than 1,000 rpm, the rotation of the buffer becomes unstable. In any case, if the number of revolutions of the buffer falls outside the aforementioned range, it would be difficult to regularly obtain an electrodeposited copper foil having a surface roughness of 1.5 μm or less.

The contact pressure of the buffer should preferably be 0.5 to 3.0 kgf/cm$^2$, more preferably 1.0 to 2.0 kgf/cm$^2$. If the contact pressure of the buffer is less than 0.5 kgf/cm$^2$, the pressure is too weak to sufficiently reduce the surface roughness to the desired extent. On the other hand, if the contact pressure of the buffer is more than 3.0 kgf/cm$^2$, the pressure on the copper foil is too great and it can affect the physical strength of the copper foil, occasionally causing the fracture of the copper foil.

The buffing should preferably be performed at a line speed in the range of from 2 to 4 m/min. If the buffing is performed at a line speed falling outside this range, the polishing may become non-uniform, making it difficult to obtain an electrodeposited copper foil having a surface roughness of 1.5 μm or less.

As for the kind of abrasive material to be employed in this buffing, there is no known limitation. However, the grain diameter of the abrasive material preferably should be confined to 5 to 50 µm. It is preferred to use a #1,000 buffer wherein aluminum oxide is employed as an abrasive material. By means of this buffing, the surface roughness of the rough side of the electrodeposited copper foil is controlled to 1.5 µm or less based on Rz. With this buffing, the original profile of the matte surface side of the copper foil which has been generated as a result of electrolysis is completely removed, and at the same time fresh very fine streaks are formed on the matte surface of the copper foil, thereby forming a matte surface having a predetermined roughness.

Subsequently, a nodule forming treatment is carried out on the buffed matte surface having a roughness of 1.5 µm or less. In this nodule forming treatment, the top portions of the convex portions (peaks) of the buffed matte surface are electrodeposited with nodular copper grains generally in preference to other portions of the buffed matte surface. Accordingly, since the number of the top portions per unit areas is large on the buffed matte surface of the copper foil the copper grains can be uniformly and densely electrodeposited on this buffed matte surface. This nodule forming treatment is performed by electrolysis using a copper electrolyte and disposing an insoluble counter electrode facing the buffed matte surface. This nodule forming treatment consists of a series of electrodeposition treatments, i.e. a fine nodular deposit, an encapsulating deposit, and a whiskery deposit, each being performed under the following electrolysis conditions.

(1) Fine Nodular Deposit

The fine nodules are deposited by disposing an insoluble counter electrode opposite the matte surface side of an electrodeposited copper foil both of which are immersed in an electrolyte under the following electrolysis conditions.

Concentration of copper: 5 to 30 g/L

Concentration of sulfuric acid: 50 to 150 g/L

Temperature of plating bath: 20° to 30° C.

Current density: 20 to 40 A/dm$^2$

Time: 5 to 15 seconds

Under these electrolysis conditions, a granular (nodular) copper electrodeposit layer, also called a "burned" electrodeposit is formed on the matte surface of the electrodeposited copper foil.

(2) Encapsulating Deposit

Then, the surface on which fine nodules have been deposited is given an encapsulating deposit under the following electrolysis conditions.

Concentration of copper: 40 to 80 g/L

Concentration of sulfuric acid: 50 to 150 g/L

Temperature of plating bath: 45° to 55° C.

Current density: 20 to 40 A/dm$^2$

Time: 5 to 15 seconds

Under these electrolysis conditions, an encapsulating deposit of copper also called a "covering" layer is formed on the aforementioned granular (nodular) copper electrodeposited layer.

(3) Whiskery Deposit

The surface which has been treated with the encapsulating deposit is further given a whiskery deposit under the following electrolysis conditions.

Concentration of copper: 5 to 30 g/L

Concentration of sulfuric acid: 30 to 60 g/L

Temperature of plating bath: 20° to 30° C.

Current density: 10 to 40 A/dm$^2$

Time: 5 to 15 seconds

Under these electrolysis conditions, a whiskery-like copper deposit is formed on the previous deposits.

The surface roughness after this nodule forming treatment of the matte surface of the copper foil should be in the range of 1.5 to 2.0 µm based on Rz. If the surface roughness based on Rz of the copper foil is less than 1.5 µm, it may be difficult to obtain sufficient peel strength when circuit lines are formed using such copper foil on a substrate. On the other hand, if the surface roughness based on Rz of the copper foil exceeds 2.0 µm, nodules of relatively large size may be caused to grow locally, resulting in poorer properties, i.e. high frequency characteristics and insulation reliability of the copper foil when fine circuit patterns are made.

After being subjected to the nodule forming treatment as mentioned above, the electrodeposited copper foil is then subjected to a corrosion resisting treatment. The conditions for this treatment may be the same as those generally employed in the art. For example, this corrosion resisting treatment may consist of zinc-plating the surface of the copper foil, then subjecting the zinc-plated surface to an electrodeposited chromate treatment, which is followed by a silane coupling treatment. Typical conditions for these steps are given below.

In the zinc-plating treatment, an electrolytic solution containing zinc at a concentration of 5 g/L and sulfuric acid at a concentration of 50 g/L, and kept at a temperature of 25° C. is employed, and the electrodeposit of zinc is formed at current density of 5 A/dm$^2$ for 8 seconds.

Then, the electrodeposited chromate treatment on the zinc surface is carried out using an electrolytic solution containing chromic anhydride at a concentration of 2 g/L, the pH being adjusted to 4, for 8 seconds with a current density is controlled to 1 A/dm$^2$.

Finally, g-glycidoxypropyltrimethoxy silane as a silane coupling agent is coated on the chromate-treated surface.

The electrodeposited copper foil obtained after these surface treatments is laminated on one surface of a resin substrate made, for instance, of glass-fiber epoxy composite or polyimide by means of thermal press-bonding or pressure bonding against the buffed and treated matte surface of the copper foil, thereby obtaining a copper clad laminate board. The smooth or shiny side of the foil is exposed.

Typically, a dry film photoresist is then superimposed on the copper clad laminate board according to known methods and exposed to a UV light and developed, thereby forming a circuit pattern. The circuit pattern formed in this manner is then subjected to an etching treatment by way of known processes, such as those using a copper chloride etching solution, thereby obtaining a printed wiring board bearing a desired wiring pattern.

In the preferred embodiment of this invention the matte surface of an electrodeposited copper foil is first polished with a buffer so as to completely remove the original profile characteristic of the matte surface and at the same time to form a fresh fine surface having a roughness of 1.5 µm or less. After buffing, a uniform fine granular (nodular) copper is electrodeposited on the matte surface. The electrodeposited copper foil so treated is suited for use in forming ultra-fine circuit patterns, which have excellent insulation reliability between lines of the circuit patterns. Moreover, since the roughness of both surfaces of the electrodeposited copper foil according to this invention is relatively low, it is possible to manufacture an electrodeposited copper foil well suited for use in the formation of an ultra-fine pattern, which has excellent insulation reliability between layers and high-frequency characteristics when the electrodeposited copper foil is used for the manufacture of a multilayer printed wiring board.

This invention will be further explained with reference to the following Example and Comparative Examples.

Example 1

The matte surface side of an 18 μm thick electrodeposited copper foil having 1.60 μm roughness (Rz) on the shiny side, 2.50 μm roughness (Rz) on the matte surface was subjected to a buffing treatment using a #1,000 buffer (Tsunoda Brush Kabushiki Kaisha) wherein aluminum oxide is employed as an abrasive material under the following conditions: 200 rpm, 1.0 kgf/cm² contact pressure and 3 m/min line speed (foil speed). As a result, the surface roughness (Rz) of matte surface side of the copper foil after buffing was found to be 1.50 μm. FIG. 1 shows a microscopic photograph (1,000 times in magnification) of a cross-section of the matte side of the electrodeposited copper foil (18 μm in thickness) before the buffing treatment, and FIG. 2 shows a microscopic photograph (1,000 times in magnification) of a cross-section of the electrodeposited copper foil after the buffing treatment of the matte surface side. As seen from these microscopic photographs, the original profile of the matte surface side was completely removed by the buffing treatment. Instead, fresh fine streaks were formed on the matte surface side by the buffing treatment.

Then, an electrolytic solution containing copper at a concentration of 12 g/L and sulfuric acid at a concentration of 100 g/L and kept at a temperature of 25° C. was employed for applying a fine nodular deposit ("burned" deposit) through electrolysis, of the buffed surface for 10 seconds at a current density of 30 A/dm² while disposing an insoluble electrode opposite the buff-treated surface. Thereafter, an encapsulating deposit ("covering" layer) was applied for 10 seconds at a current density of 30 A/dm² using an electrolytic solution containing copper at a concentration of 60 g/L and sulfuric acid at a concentration of 100 g/L and kept at a temperature of 50° C. Then, a whiskery deposit was applied for 10 seconds at a current density of 10 A/dm² using an electrolytic solution containing copper at a concentration of 12 g/L and sulfuric acid at a concentration of 45 g/L and kept at a temperature of 25° C.

Figure 3:
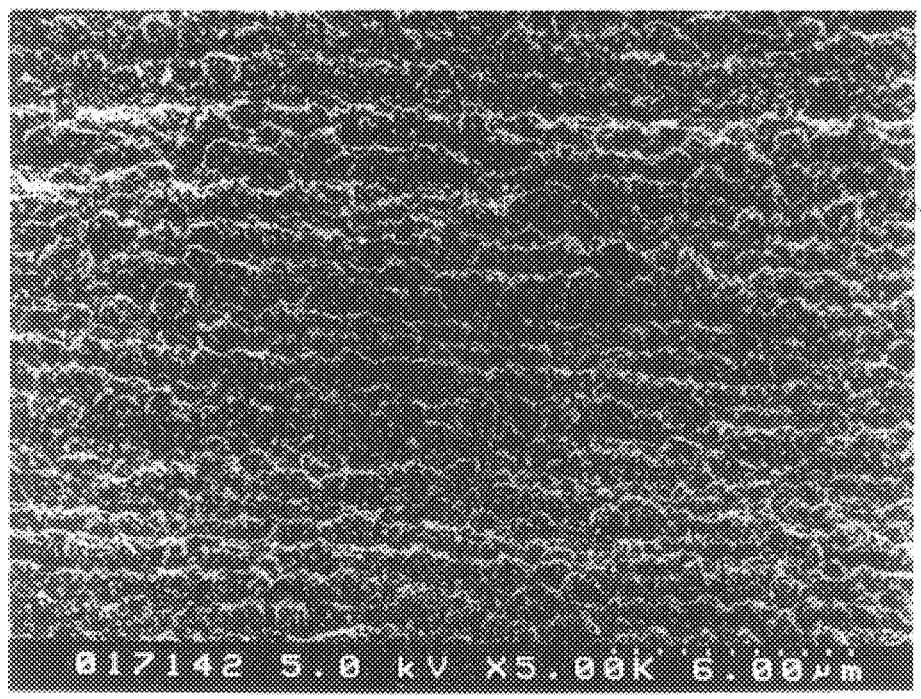
FIG. 3 is a microscopic photograph showing a surface of an electrodeposited copper foil provided thereon with a granular (nodular) copper layer according to Example 1.

The surface roughness (Rz) of the matte surface side of the copper foil after the nodule forming treatment was found to be 1.89 μm. FIG. 3 shows a microscopic photograph (5,000 times in magnification) of the matte surface of the electrodeposited copper foil after the nodule forming treatment. As seen from the microscopic photograph shown in FIG. 3, nodules formed of granular copper were electrodeposited along the fine concave/convex shape of the buff-treated surface side. The rotary buffing produced linear abrasions (streaks) on the surface of the foil which became the site for the copper nodule deposits.

Then, a corrosion resisting treatment was performed as follows on the matte surface of the electrodeposited copper foil on which copper nodules or granules had been formed.

First, the matte surface was plated with zinc by being exposed for 8 seconds at a current density of 5 A/dm² in an electrolytic solution containing zinc at a concentration of 5 g/L, and sulfuric acid at a concentration of 50 g/L and kept at a temperature of 25° C. Thereafter, an electrolytic chromating treatment was carried out for 5 seconds at a current density of 1 A/dm² using an electrolytic solution containing chromic anhydride at a concentration of 2 g/L and adjusted in pH to 4. Subsequently, the resulting foil was washed with running water and dried with hot air.

The electrodeposited copper foil obtained after these surface treatments was laminated to one surface of a resin substrate made of glass-fiber epoxy composite (FR-4) by means of thermal press-bonding of the buffed and treated matte surface of the copper foil to the resin substrate, thereby obtaining a copper clad laminate board.

After lamination, the copper foil surface which is exposed (the shiny side) was brushed before a circuit pattern was produced.

Then, a dry film photo resist (Nichigo Alfa Kabushiki Kaisha) was superimposed on this copper clad laminate board and exposed to a UV light, using, a pattern having a linewidth of 50 μm and a circuit interval (space) of 100 μm, and developed, thereby forming a circuit pattern. The circuit pattern formed in this manner was then etched at a temperature of 50° C. for 30 seconds using a commercially available copper chloride etching solution, thereby obtaining a printed wiring board bearing the desired wiring pattern.

The following tests were conducted on this printed wiring board.

Figure 4:
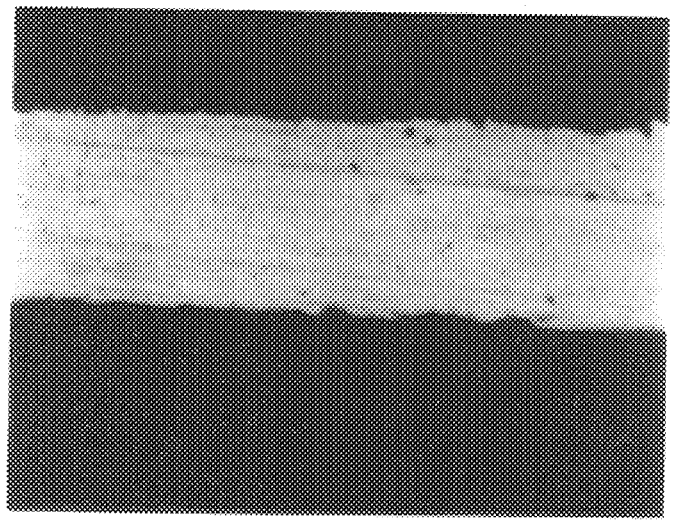
FIG. 4 is microscopic photograph showing a cross-sectional view in the longitudinal direction of a portion of a wiring pattern.
Figure 5:
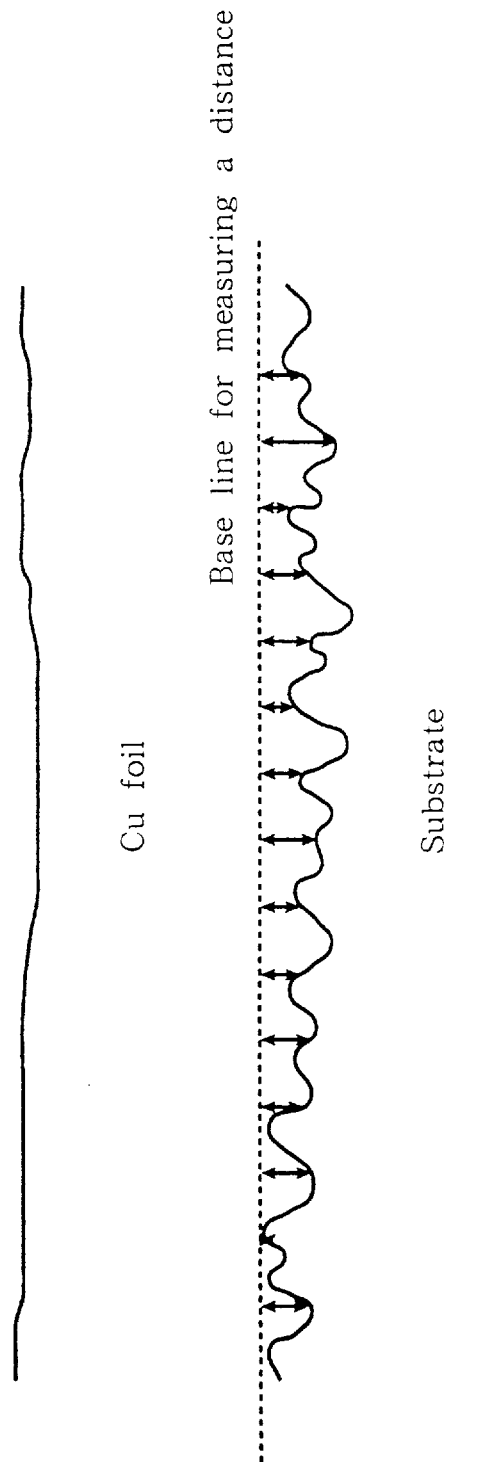
FIG. 5 is a schematic view of an electrodeposited copper foil laminated to a substrate and illustrating a method for calculating an average value and standard deviation of copper grains embedded in the substrate.

(1) The size of copper grains embedded in the glass-fiber epoxy composite substrate:

A piece of the printed wiring board was embedded in a cold embedding resin and kept for a whole day and night so as to allow the resin to be completely cured. Thereafter, a photograph (1,500 times in magnification) of the cross-section of the circuit pattern in the longitudinal direction was taken by making use of an microscope (FIG. 4). Then, a straight line was drawn as shown in FIG. 5 and the distance from this straight line to the copper grains was measured at 15 measuring points. Then, an average value and standard deviation of the measured distances were calculated. This standard deviation of the measured distances is indicative of the non-uniformity in size of copper grains, i.e. the smaller this standard deviation is, the smaller the non-uniformity in size of the copper grains.

The average value obtained was 0.48 μm and the standard deviation obtained was 0.43 μm.

Figure 6:
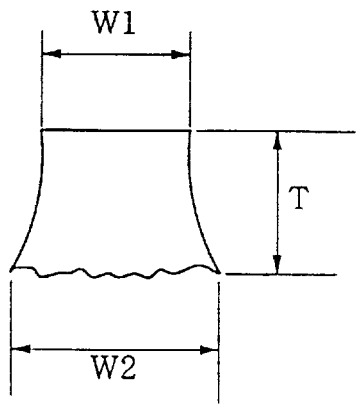
FIG. 6 is a schematic view of the cross-section of a circuit line illustrating a method for calculating an etching factor.

(2) Etching factor:

The etching factor was calculated by referring to the microscopic photograph of 600 times in magnification of a piece of the same cross-section as explained in (1). Namely, as shown in FIG. 6, the top width of the wiring pattern of the printed wiring board was defined as W1, the bottom width of the wiring pattern of the printed wiring board was defined as W2 and the thickness of the copper foil was defined at T in the calculation of the etching factor Ef according to the following equation.

$$Ef = 2T/(W2 - W1)$$

It can be understood from this equation that as the section of the circuit pattern approaches a square shape, the etching factor becomes larger. The etching factor obtained in Example 1 was 3.69 for an average of six sectional pieces.

Figure 8:
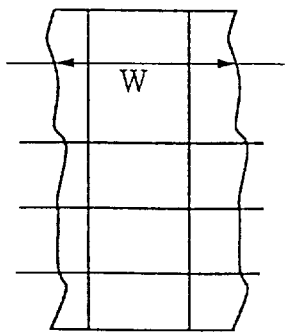
FIG. 8 is a schematic view for illustrating a method for calculating the linearity of a circuit.
Figure 7:
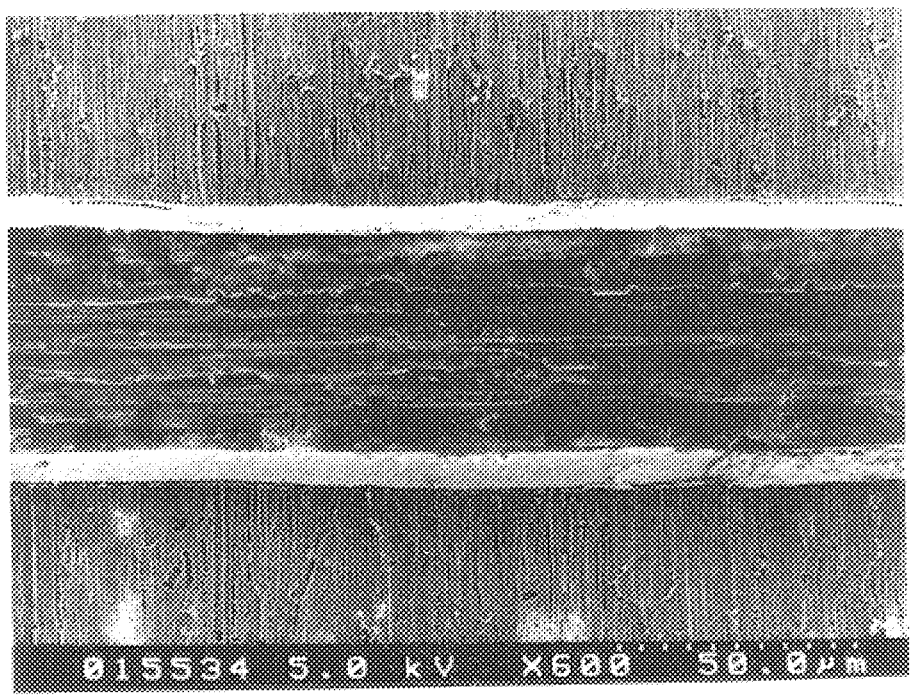
FIG. 7 is a electron-microscopic photograph showing a circuit line obtained according to Example 1.

(3) Linearity of wiring pattern:

A glass-fiber epoxy composite substrate was press-bonded onto the buffed treated matte surface of the electrodeposited copper foil prepared as described above to manufacture a circuit pattern having line widths of 50 μm and spaces of 100 μm. This circuit pattern was then mounted on a sample table of an electron microscope and the microscopic photograph of 600 times in magnification of the circuit pattern (FIG. 7) was taken by making use of a field emission type electron microscope (Hitachi Seisakusho, S-4100). Since both surfaces of electrodeposited copper foil obtained according to this invention were low in roughness, the linearity of the circuit was excellent. The etching characteristics were evaluated from the degree of irregularity at the bottom of the circuit lines, as follows. A pair of parallel straight lines were drawn in the longitudinal direction of the circuit line as shown in FIG. 8 and then the width of the bottom of the circuit was measured at 15 measuring points which were set apart equidistantly. Then, an average value and standard deviation of the measured widths were calculated. This standard deviation of the measured widths is indicative of the degree of linearity at the bottom of the circuit, i.e. the smaller this standard deviation is, the smaller the non-uniformity in width of the circuit line, which means that it is closer to being a straight line. As a matter of fact, the standard deviation in width of the circuit according to this invention was found to be 0.67 $\mu$m, indicating an excellent linearity of the circuit lines. Therefore, the copper remnants at the bottom of the circuit after etching are few in this invention, so that it is possible to obtain excellent inter-circuit insulation.

(4) Peel strength:

The peel strength of a wiring pattern with 10mm line width was measured. The peel strength of the wiring pattern was found to be 1.02 kgf/cm.

The results of these evaluation tests are summarized in Table 1.

Comparative Example 1

Figure 9:
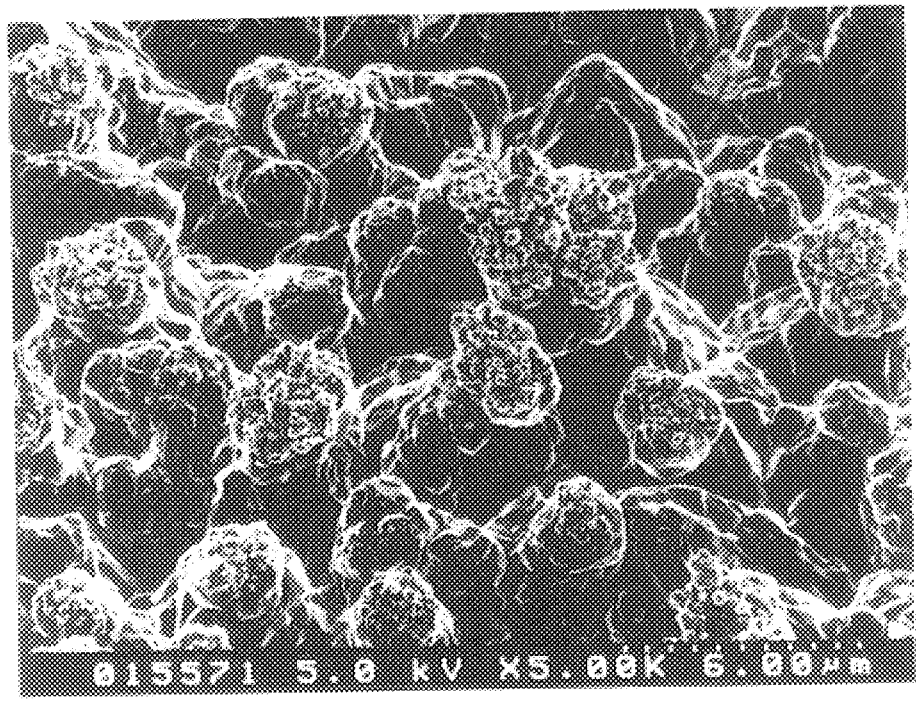
FIG. 9 is a microscopic photograph showing a surface of an electrodeposited copper foil provided thereon with a granular (nodular) copper layer according to Comparative Example 1.

Copper deposits were placed on the matte side of an electrodeposited copper foil with 18 $\mu$m in thickness, 1.60 $\mu$m in roughness (Rz) at the shiny surface side thereof, 4.60 $\mu$m in roughness (Rz) at the matte surface side thereof under the same conditions as in Example 1, but without performing the buffing treatment of the invention. The surface roughness of the matte surface side of the copper foil was found to be 5.75 $\mu$m after the nodule forming treatment. FIG. 9 shows a microscopic photograph (5,000 times in magnification) of the matte surface side of the electrodeposited copper foil after the deposition of the granular copper layer. As seen from FIG. 9, nodules formed of granular copper were irregularly electrodeposited on the matte surface side of the copper foil, rather than aligned as shown in FIG. 3.

Then, a corrosion resisting treatment was carried out on the treated matte surface of the electrodeposited copper foil bearing the granular copper layers under the same conditions as in Example 1.

The electrodeposited copper foil obtained after these surface treatments was laminated to the surface of a resin substrate made of glass fiber-epoxy composite by means of thermal press-bonding with the treated matte side of the copper foil facing the substrate, thereby obtaining a copper clad laminate board. The exposed shiny surface of the copper foil was brushed prior to forming of a circuit pattern.

Then, this copper clad laminate board was exposed, via a photoresist film bearing a pattern with a line width of 50 $\mu$m and a circuit interval (space) of 100 $\mu$m, to a UV light in the same manner as in Example 1, and developed, thereby forming a circuit pattern. The circuit pattern formed in this manner was then subjected to etching to obtain a printed wiring board.

Then, the evaluation tests were conducted on this printed wiring board in the same manner as in Example 1.

The average size of copper grains embedded in the fiber-glass epoxy composite substrate was found to be 2.01 $\mu$m and the standard deviation was 1.67 $\mu$m.

The etching factor was found to be 1.86 for an average of six sectional pieces.

Figure 10:
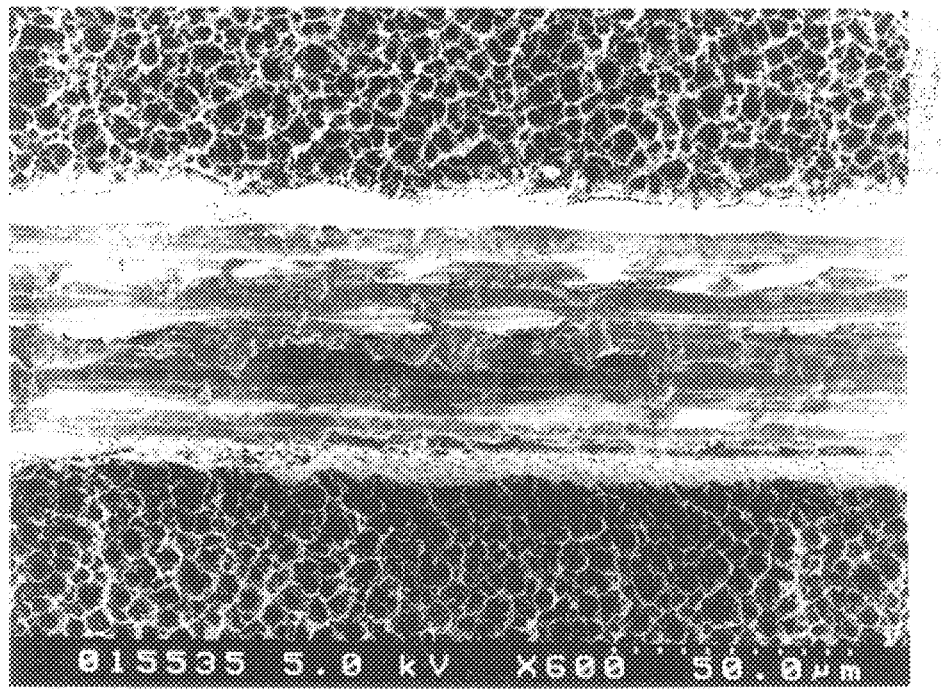
FIG. 10 is an electron-microscopic photograph showing a circuit line obtained according to Comparative Example 1.

Then, a fiber-glass epoxy composite substrate was press-bonded onto the treated surface of the electrodeposited copper foil in the same manner as in Example 1. The exposed surface was brushed and a circuit pattern having line widths of 50 $\mu$m and spaces of 100 $\mu$m was made as previously described. Thereafter, a microscopic photograph of 600 times in magnification of this circuit pattern (FIG. 10) was taken in the same manner as in Example 1. As apparent from the microscopic photograph, since the matte surface of electrodeposited copper foil according to this Comparative Example 1 was high in roughness, the linearity of the circuit was poor.

A pair of parallel straight lines were drawn in the longitudinal direction of the circuit line in the same manner as in Example 1, and then the width of the bottom of the circuit was measured at 15 measuring points which were set apart equidistantly. Then, an average value and standard deviation of the measured widths were calculated.

The peel strength of a wiring pattern with 10 mm line width was found to be 1.51 kgf/cm.

The results of the evaluation tests are summarized in Table 1.

Comparative Example 2

Figure 11:
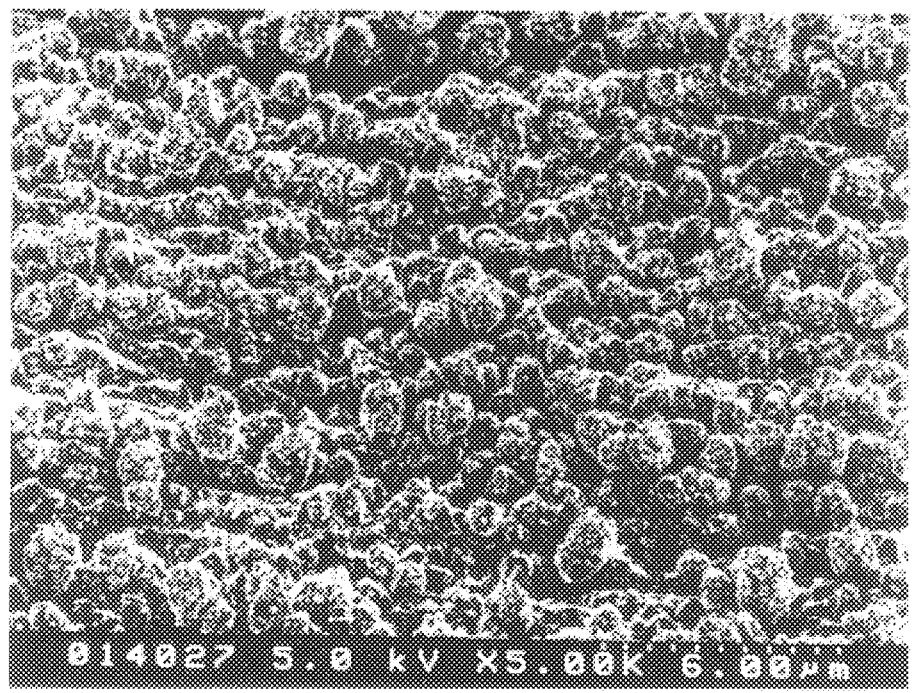
FIG. 11 is a microscopic photograph showing a surface of an electrodeposited copper foil provided thereon with a granular (nodular) copper layer according to Comparative Example 2.

A granular copper layer was deposited on the shiny side of the same electrodeposited copper foil as employed in Example 1, i.e. 18 $\mu$m in thickness, 1.60 $\mu$m in roughness (Rz) at the shiny surface, 2.50 $\mu$m in roughness (Rz) at the matte surface under the same conditions as explained in Example 1, but without performing the buffing treatment of the invention. The surface roughness of the resultant shiny side of the copper foil was found to be 2.09 $\mu$m. FIG. 11 shows a microscopic photograph (5,000 times in magnification) of the shiny side of the electrodeposited copper foil after the deposition of the granular copper layer. As seen from FIG. 11, nodules formed of granular copper were irregularly electrodeposited on the shiny surface of the copper foil.

Then, a corrosion resisting treatment was performed on the shiny side of the electrodeposited copper foil having a granular copper layer as explained above under the same conditions as in Example 1.

The resulting treated copper foil was laminated to one surface of a resin substrate with the shiny side against the substrate following the procedures of the previous examples. The exposed matte side was brushed prior to forming a circuit pattern.

Then, this electrodeposited copper was exposed on the matte side, via a film photoresist having a pattern with a line width of 50 $\mu$m and a circuit interval (space) of 100 $\mu$m, to a UV light in the same manner as in Example 1 and then developed, thereby forming a circuit pattern. The circuit pattern formed in this manner was then subjected to etching to obtain a printed wiring board as before.

Then, the evaluation tests were conducted on this printed wiring board in the same manner as in Example 1.

The size of copper grains embedded in the fiber-glass epoxy composite substrate was found to be 0.98 $\mu$m in average and the standard deviation was 0.871 $\mu$m.

The etching factor was found to 2.22 for an average of six sectional pieces.

Figure 12:
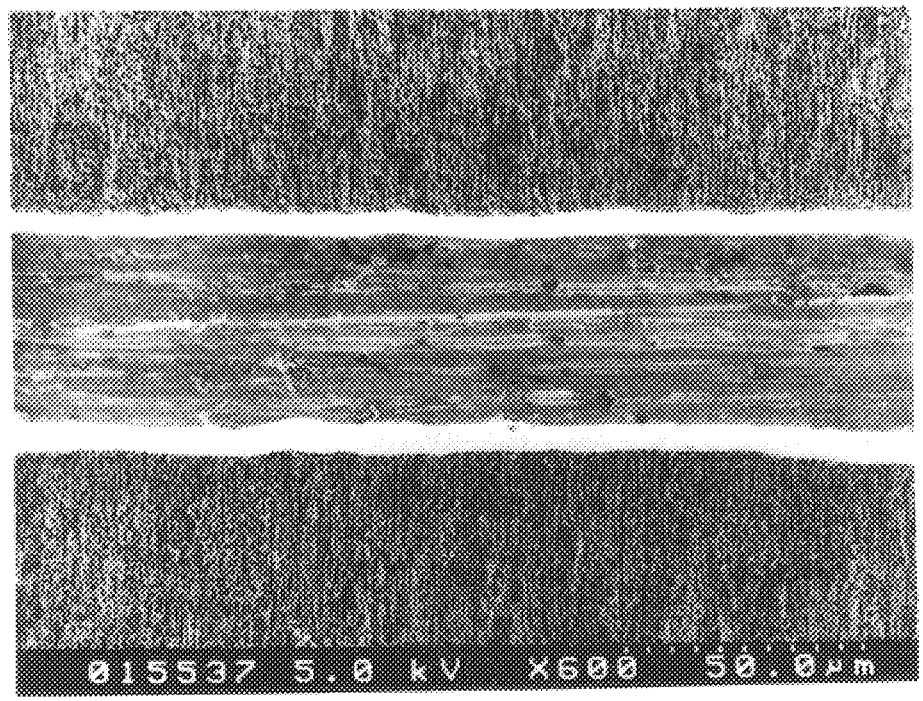
FIG. 12 is an electron-microscopic photograph showing a circuit line obtained according to Comparative Example 2.

Then, a fiber-glass epoxy composite substrate was press-bonded onto the treated shiny side of the electrodeposited copper foil using the same procedures described above and a circuit pattern having a line width from 50 μm and spaces of 100 μm was formed. Thereafter, the microscopic photograph of 600 times in magnification of this circuit pattern (FIG. 12) was taken in the same manner as in Example 1. As apparent from the microscopic photograph, the linearity of the circuit was not sufficient for use in the formation of an ultra-fine pattern, although it was superior to that of Comparative Example 1.

A pair of parallel straight lines were drawn in the longitudinal direction of the circuit line in the same manner as in Example 1, and the width of the bottom of the circuit was measured at 15 measuring points which were set apart equidistantly. Then, an average value and standard deviation of the measured widths were calculated.

The peel strength of a wiring pattern with 10 mm line width was found to be 1.13 kgf/cm.

TABLE 1

|  |  | Example 1 | Comparative Example 1 | Comparative Example 1 |
|---|---|---|---|---|
| Average surface roughness before treatment [Rz] (μm) (a) |  | 2.50 (matte side) | 4.60 (matte side) | 1.60 (shiny side) |
| Average surface roughness after brushing [Rz] (μm) (a) |  | 1.50 | N/A | N/A |
| Average surface roughness after deposition of granular copper layer [Rz] (μm) (a) |  | 1.89 | 5.75 | 2.09 |
| Diameter of granular Cu | Average (μm) (b) | 0.97 | 1.52 | 1.34 |
|  | Standard Deviation (μm) (b) | 0.113 | 0.49 | 0.276 |
| Depth of Cu grains embedded in substrate | Average (μm) (c) | 0.48 | 2.01 | 0.98 |
|  | Standard Deviation (μm) (c) | 0.430 | 1.67 | 0.781 |
| Circuit width bottom | Average (μm) (d) | 50.8 | 63.5 | 68.3 |
|  | Standard Deviation (μm) (d) | 0.67 | 2.89 | 1.02 |
| Etching factor |  | 3.69 | 1.86 | 2.22 |
| Peel strength (kgf/cm) |  | 1.02 | 1.51 | 1.13 |
| Insulation reliability | Interlayer insulation | Very good | Bad | Good |
|  | Intercircuit insulation | Very good | Bad | Good |

Note:
(a) An average value of three measuring points as measured with a surface roughness tester.
(b) An average value and standard deviation of copper grains, which were obtained as the diameter of the copper grains were measured at ten points at random from a microscopic photograph (5,000 times in magnification) of the matte surface side of the copper foil.
(c) An average value and standard deviation of the depth of nodules, which were obtained as the glass fiber-epoxy composite substrate was pressure-bonded onto the matte surface side of the copper foil, and the depth of nodules embedded in the substrate was measured at 5 measuring points.
(d) An average value and standard deviation of the width of circuit, which were obtained as the fiber-glass epoxy substrate was pressure-bonded onto the buff-treated surface side of the copper foil, and a circuit having a line width of 50 μm and spaces of 100 μm was formed on the copper foil, which was then measured at 15 measuring points.

What is claimed is:

1. An electrodeposited copper foil having a matte side and a shiny side in which the original profile of the surface of said matte side has been completely removed by buffing and fine roughness having linear streaks has been newly formed thereon, said buffed surface having a surface roughness of Rz of 1.5 μm or less,
and thereafter said buffed surface has been given a nodule forming treatment to produce a roughness of Rz 1.5–2.0 μm.

2. An electrodeposited copper foil of claim 1, wherein a corrosion resisting layer is deposited on said matte side after said nodule forming treatment.

3. An electrodeposited copper foil of claim 2, wherein said corrosion resisting layer is composed of a zinc layer and a chromate-treatment layer formed on said zinc layer.

4. An electrodeposited copper foil of claim 3, wherein a silane coupling layer is deposited on said chromate-treatment layer.

* * * * *